(12) United States Patent
Iwasaki et al.

(10) Patent No.: US 8,445,983 B2
(45) Date of Patent: May 21, 2013

(54) SEMICONDUCTOR DEVICE FOR PERFORMING PHOTOELECTRIC CONVERSION

(75) Inventors: Atsushi Iwasaki, Chiba (JP); Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/136,004

(22) Filed: Jul. 20, 2011

(65) Prior Publication Data
US 2011/0278686 A1    Nov. 17, 2011

Related U.S. Application Data

(62) Division of application No. 11/709,496, filed on Feb. 22, 2007, now Pat. No. 8,022,492.

(30) Foreign Application Priority Data

Feb. 24, 2006    (JP) .................................. 2006-048395

(51) Int. Cl.
*H01L 27/14*    (2006.01)
(52) U.S. Cl.
USPC ........... 257/431; 257/290; 257/292; 257/294; 257/372; 257/E27.133

(58) Field of Classification Search
USPC ........... 257/290, 292, 294, 372, 431, E27.133
See application file for complete search history.

(56) References Cited

U.S. PATENT DOCUMENTS

2006/0151814 A1 *    7/2006    Ito et al. ...................... 257/257

* cited by examiner

*Primary Examiner* — Lynne Gurley
*Assistant Examiner* — Vernon P Webb
(74) *Attorney, Agent, or Firm* — Adams & Wilks

(57) ABSTRACT

A semiconductor device for performing photoelectric conversion of incident light includes a substrate and a well region having different conductivity types. A depletion layer is generated in a vicinity of a junction interface between the substrate and the well region. A first trench has a depth equal to a height up to a top portion of the depletion layer generated on a bottom side of the well region and a width extending to a heavily doped region formed in the well region. A second trench has a depth larger than that of a portion of the depletion layer generated on the bottom side of the well region and a width larger than that of portions of the depletion layer generated on the sides of the well region. The second trench surrounds the first trench so as to confine the depletion layer under the first trench except for a region thereof under the heavily doped region. An insulator is buried into each the first trench and the second trench.

12 Claims, 7 Drawing Sheets

Prior Art

SEMICONDUCTOR DEVICE FOR PERFORMING PHOTOELECTRIC CONVERSION

CROSS REFERENCE TO RELATED APPLICATION

This application is a division of application Ser. No. 11/709,496 filed Feb. 22, 2007, now U.S. Pat. No. 8,022,492, which is hereby incorporated by reference, and priority thereto for common subject matter is hereby claimed.

BACKGROUND OF THE INVENTION

1. Field of the Invention

The present invention relates to a semiconductor device for use in an image sensor and a method of manufacturing the semiconductor device.

2. Description of the Related Art

An image sensor is, for example, an array of cells each having a photodiode arranged in a plane. Typically, incident light enters a color filter or a prism, and is separated into light having a wavelength of a red band (R band), a green band (G band), and a blue band (B band). By directing the separated light to cells having the same structure, respectively, intensity of the incident light is detected with regard to the respective wavelengths of the R, G, and B bands. Another image sensor directs light having wavelengths of R, G, and B bands to the same cell in a time-sharing manner and detects intensity of incident light with regard to the respective wavelengths of R, G, and B bands for each divided time.

FIG. 1 illustrates a structure of a cell for a typical image sensor.

As illustrated in FIG. 1, a cell (a photodiode) of the image sensor has an n-type well 2 formed in a predetermined region of a p-type substrate 1, a field oxide film 3 formed by local oxidation of silicon (LOCOS) at an upper edge of the n-type well 2 for isolation, a heavily doped n-type region 4 for making electric connection with the n-type well 2, an interlayer insulating film 5 formed on the field oxide film 3, metal line 6 formed through the interlayer insulating film 5 and connected with the heavily doped n-type region 4, and a protective film 7 formed on the interlayer insulating film 5 and the metal line 6, for protecting the device. It should be noted that, as disclosed in JP 04-099066 A, there is another type of device in which isolation is performed by a trench insulating layer around one cell. In the cell having the above-mentioned structure, depletion layers $K_1$ to $K_3$ are generated in the vicinity of junction interfaces $J_1$ to $J_3$, respectively, between the p-type substrate 1 and the n-type well 2. When incident light 9 enters, light absorbed in the device causes generation of carriers 10 (electron-hole pairs). Movement of the carriers 10 generated mainly in the depletion layers $K_1$ to $K_3$ to the p-type region and the n-type region respectively generates electric current to perform photoelectric conversion.

As illustrated in FIG. 1, the junction interfaces $J_1$ to $J_3$ between the p-type substrate 1 and the n-type well 2 includes the junction interface $J_1$ in parallel with a light incidence plane and the junction interfaces $J_2$ and $J_3$ perpendicular to the light incidence plane. The depletion layers $K_2$ and $K_3$ generated by the junction interfaces $J_2$ and $J_3$ are therefore regions which are disposed substantially in parallel with the incident light 9 in a depth direction of the p-type substrate 1. Consequently there are regions which greatly contribute to the photoelectric conversion and which do not contribute to the photoelectric conversion at all, that is, regions which greatly contribute to sensitivity of the device and which do not contribute to the sensitivity at all. Regarding a function as an electric circuit, since the depletion layers $K_1$ to $K_3$ work as capacitors $C_1$ to $C_3$, having a depletion layer which does not contribute to the sensitivity of the device means having an excess parasitic capacitance, which causes lowering of output voltage at the time of photoelectric conversion. This is obvious from the fact that, in the above-mentioned structure of the device, according to the relationship between voltage and capacitance (V=Q/C), an output voltage V lowers as a capacitance C increases. Therefore, in order to magnify the output voltage V, that is, in order to enhance the photoelectric conversion efficiency and the sensitivity of the device, it is desirable to increase an electric charge Q or to decrease the capacitance C.

As described above, there is a problem in that the output voltage cannot be raised in the photoelectric conversion since a cell having a conventional structure has excess capacitance. It should be noted that, in terms of decreasing the parasitic capacitance, JP 2004-040126 A discloses methods such as to devise a structure of a well itself. However, none of the methods focuses on the capacitances $C_2$ and $C_3$ of the depletion layers $K_2$ and $K_3$ formed on sides of the well. In particular, it is desirable to dispose the depletion layer $K_1$ on a bottom side at a predetermined depth in order to perform the photoelectric conversion efficiently. However, in this case, not only the regions of the depletion layers $K_2$ and $K_3$ on the sides increases, but also the capacitances $C_2$ and $C_3$ of the depletion layers $K_2$ and $K_3$ increases, which is a large obstacle for efficient photoelectric conversion.

In particular, currently, with growing popularity in digital cameras and the like, an image sensor of higher resolution, that is, an image sensor having a larger number of pixels is desired. However, in order to make the number of pixels large without increasing the size of the image sensor as a whole, an area per cell needs to be made smaller, and thus, a semiconductor device with a small area per cell and yet with high photoelectric conversion efficiency is desired.

SUMMARY OF THE INVENTION

The present invention has been made in view of the above-mentioned problem, and an object of the present invention is to provide a semiconductor device in which a parasitic capacitance is decreased and an output voltage is increased when photoelectric conversion is performed, and a method of manufacturing the semiconductor device.

To solve the above-mentioned problem, according to a first aspect of the invention, there is provided a semiconductor device for performing photoelectric conversion of incident light, including: a substrate formed of one of an n-type semiconductor and a p-type semiconductor; a well region having a predetermined depth, which is formed in a predetermined region of the substrate and formed of the other one of the n-type semiconductor and the p-type semiconductor; a depletion layer generated in a vicinity of a junction interface between the substrate and the well region; and trenches having a depth larger than that of a portion of the depletion layer generated on a bottom side of the well region and a width larger than that of portions of the depletion layer generated on sides of the well region, which are provided so as to remove the junction interface on the sides of the well region, in which the trenches have an insulator buried therein.

To solve the above-mentioned problem, according to a second aspect of the invention, there is provided a semiconductor device for performing photoelectric conversion of incident light, including: a substrate formed of one of an n-type semiconductor and a p-type semiconductor; a well region having a predetermined depth, which is formed in a predetermined region of the substrate and formed of the other one of the n-type semiconductor and the p-type semiconductor; a depletion layer generated in a vicinity of a junction interface between the substrate and the well region; a first trench having a depth equal to a height up to a top portion of the depletion layer generated on a bottom side of the well region and a width extending to a heavily doped region formed in the well region, which is provided so as to remove the junction interface on sides of the well region; and a second trench having a depth larger than that of a portion of the depletion layer generated on the bottom side of the well region and a width larger than that of portions of the depletion layer generated on the sides of the well region, which is provided next to the first trench so as to remove the junction interface on the sides of the well region, in which the first trench and the second trench have an insulator buried therein.

To solve the above-mentioned problem, according to a third aspect of the invention, there is provided a semiconductor device for performing photoelectric conversion of incident light, including: a substrate formed of one of an n-type semiconductor and a p-type semiconductor; a well region having a predetermined depth, which is formed in a predetermined region of the substrate and formed of the other one of the n-type semiconductor and the p-type semiconductor; a depletion layer generated in a vicinity of a junction interface between the substrate and the well region; and trenches in a shape of an inverse triangle in section, having a depth larger than that of a portion of the depletion layer generated on a bottom side of the well region, an upper width extending to a heavily doped region formed in the well region, and a width of a depth position of the depletion layer generated on the bottom side of the well region larger than that of portions of the depletion layer generated on sides of the well region, which are provided so as to remove the junction interface on the sides of the well, region, in which the trenches have an insulator buried therein.

To solve the above-mentioned problem, according to a fourth aspect of the invention, in the semiconductor device according to anyone of the first to third aspects of the invention, the insulator is one of silicon'oxide and a silicon based insulating compound having a low permittivity.

To solve the above-mentioned problem, according to a fifth aspect of the invention, there is provided a method of manufacturing a semiconductor device for performing photoelectric conversion of incident light, including: forming in a predetermined region of a substrate formed of one of an n-type semiconductor and a p-type semiconductor a well region having a predetermined depth, which is formed of the other one of the n-type semiconductor and the p-type semiconductor; forming trenches having a depth larger than that of a portion of the depletion layer generated on a bottom side of the well region and a width larger than that of portions of the depletion layer generated on sides of the well region, which are provided so as to remove the junction interface on the sides of the well region; and burying an insulator in the trenches.

To solve the above-mentioned problem, according to a sixth aspect of the invention, there is provided a method of manufacturing a semiconductor device for performing photoelectric conversion of incident light, including: forming in a predetermined region of a substrate formed of one of an n-type semiconductor and a p-type semiconductor a well region having a predetermined depth, which is formed of the other one of the n-type semiconductor and the p-type semiconductor; forming a first trench having a depth equal to a height up to a top portion of the depletion layer generated on a bottom side of the well region and a width extending to a heavily doped region formed in the well region, which is provided so as to remove the junction interface on sides of the well region; forming a second trench having a depth larger than that of a portion of the depletion layer generated on the bottom side of the well region and a width larger than that of portions of the depletion layer generated on the sides of the well region, which is provided next to the first trench so as to remove the junction interface on the sides of the well region; and burying an insulator in the first trench and the second trench.

To solve the above-mentioned problem, according to a seventh aspect of the invention, there is provided a method of manufacturing a semiconductor device for performing photoelectric conversion of incident light, including: forming in a predetermined region of a substrate formed of one of an n-type semiconductor and a p-type semiconductor a well region having a predetermined depth, which is formed of the other one of the n-type semiconductor and the p-type semiconductor; forming trenches in a shape of an inverse triangle in section, having a depth larger than that of a portion of the depletion layer generated on a bottom side of the well region, an upper width extending to end a heavily doped region formed in the well region, and a width of a depth position of the depletion layer generated on the bottom side of the well region larger than that of portions of the depletion layer generated on sides of the well region, which are provided so as to remove the junction interface on the sides of the well region; and burying an insulator in the trenches.

To solve the above-mentioned problem, according to an eighth aspect of the invention, in the method of manufacturing a semiconductor device according to the seventh aspect of the invention, the trenches in the shape of the inverse triangle are formed by wet etching using an alkali aqueous solution.

To solve the above-mentioned problem, according to a ninth invention, in the method of manufacturing a semiconductor device according to any one of the fifth to eighth aspects of the invention, the insulator is one of silicon oxide and a silicon based insulating compound having a low permittivity.

According to the present invention, because the junction interface on the sides of the well region, that is, the depletion layers on the sides of the well region are removed, the parasitic capacitance of the device itself can be decreased, and thus, the output voltage is raised. In addition, isolation can be performed and leakage current can be decreased. As a result, the sensitivity of the device can be improved.

DETAILED DESCRIPTION OF THE PREFERRED EMBODIMENTS

A semiconductor device according to the present invention seeks to perform highly efficient photoelectric conversion by focusing on depletion layers in the vicinity of junction interfaces between a well structure formed in a predetermined region of a substrate and the substrate on a side surface thereof, and by removing the depletion layers. Specifically, the depletion layers on the sides of the well structure do not necessarily contribute to improvement of the photoelectric conversion. On the contrary, due to their parasitic capacitances, the depletion layers lower the output voltage in the photoelectric conversion. Therefore, in order to perform photoelectric conversion more efficiently, it is desirable to remove the excess depletion layers on the sides to decrease the excess parasitic capacitance. This improves the output voltage of the device.

Embodiment modes of the semiconductor device according to the present invention are described below with reference to FIGS. 2 to 6.

(Embodiment 1)

Figure 1:
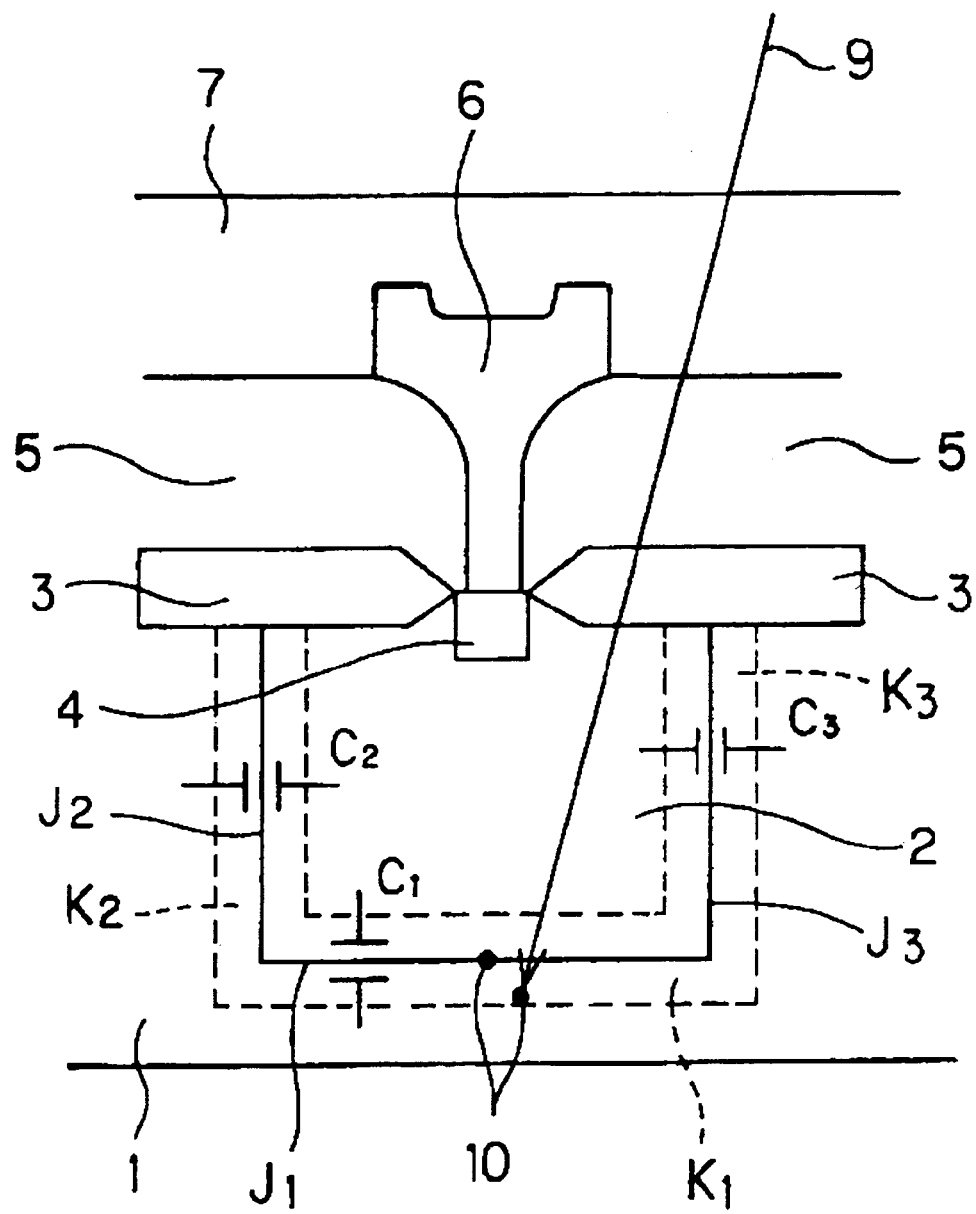
FIG. 1 illustrates a structure of a cell of an image sensor.
Figure 2:
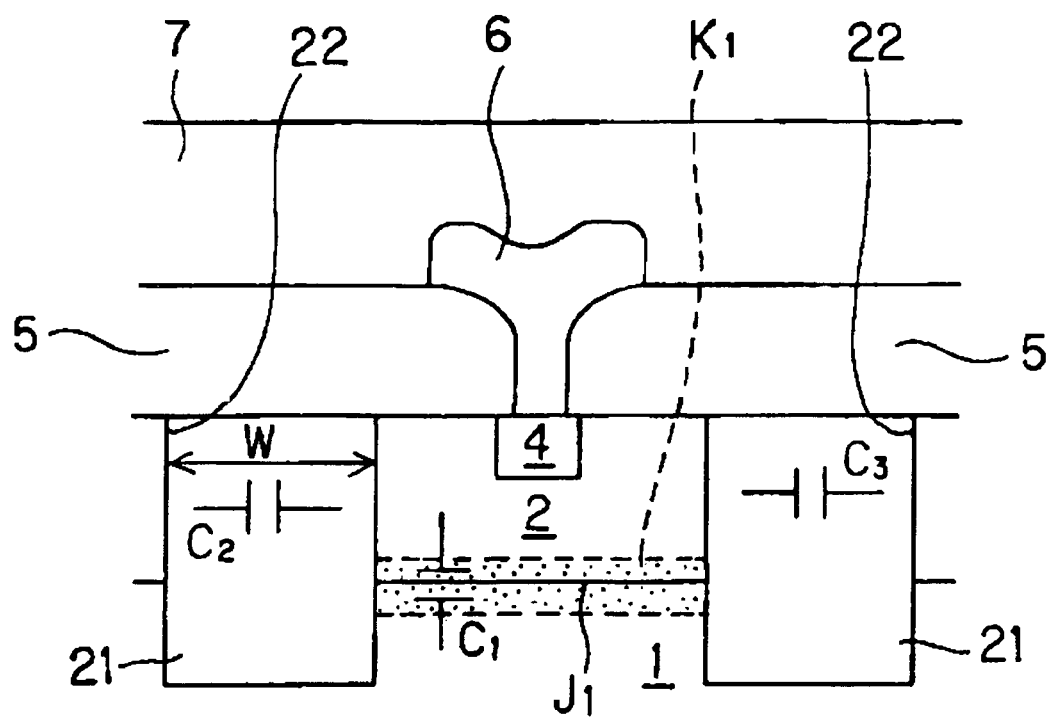
FIG. 2 illustrates a structure of an exemplary semiconductor device (Embodiment 1) according to the present invention.
Figure 3:
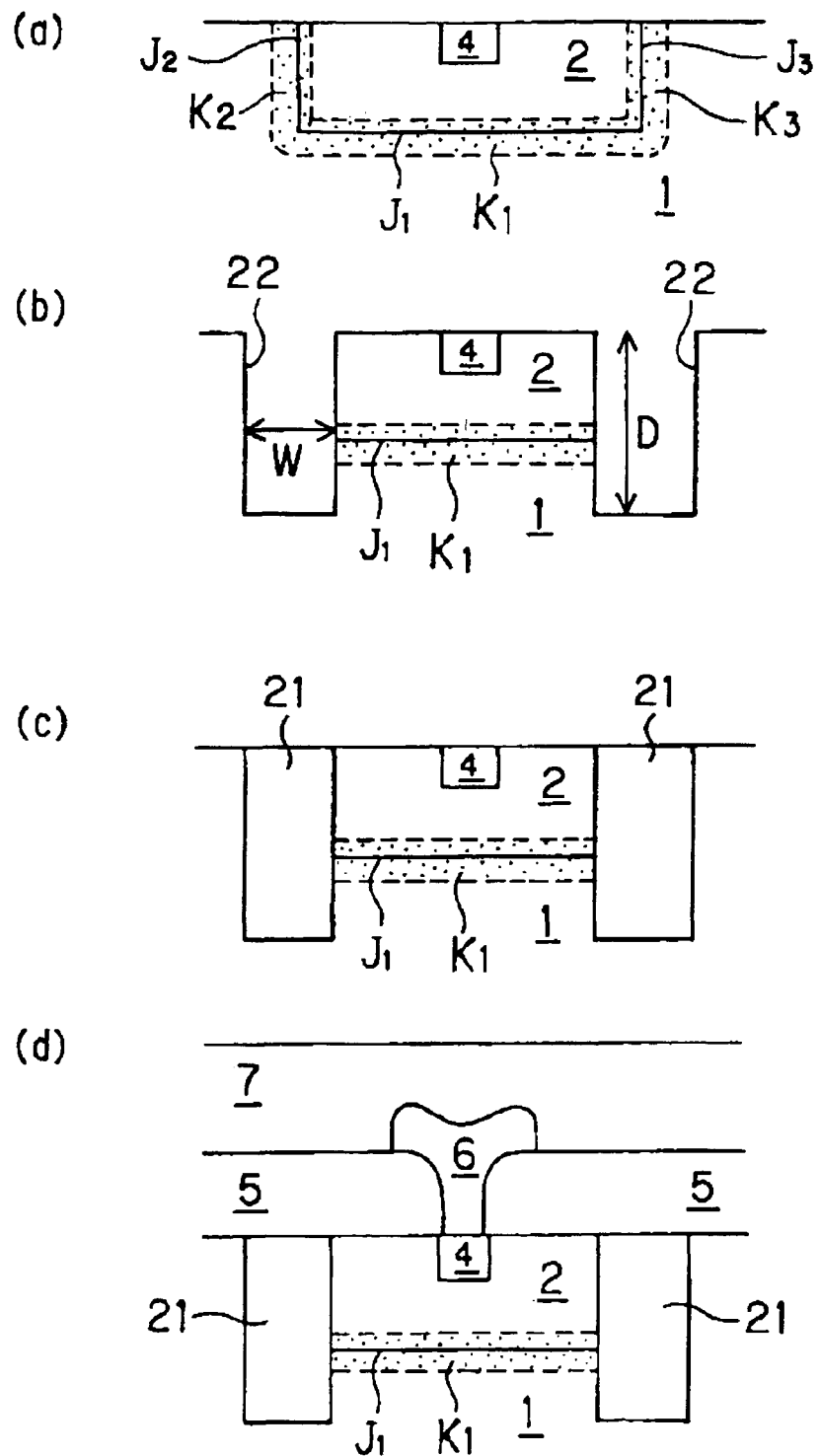
FIGS. 3A to 3D illustrate a method of manufacturing the semiconductor device illustrated in FIG. 2.

FIG. 2 illustrates a structure of a semiconductor device according to the present invention. FIGS. 3A to 3D illustrate a method of manufacturing the semiconductor device illustrated in FIG. 2. It should be noted that, in FIGS. 2 and 3A to 3D, the same reference numerals are used to designate the same members as those in the semiconductor device illustrated in FIG. 1.

As illustrated in FIG. 2, the semiconductor device of this embodiment has, as a cell (a photodiode) of an image sensor, an n-type well 2 formed in a predetermined region of a p-type substrate 1, an insulating layer 21 formed of an oxide film or the like for isolation, a heavily doped n-type region 4 for making electric connection with the n-type well 2, an interlayer insulating film 5 formed on the insulating layer 21 and the n-type well 2, metal line 6 formed through the interlayer insulating film 5 and connected with the heavily doped n-type region 4, and a protective film 7 formed on the interlayer insulating film 5 and the metal line 6, for protecting the device. It should be noted that the combination of the p-type and the n-type is not limited to those described above, and an opposite combination may also be used.

In the semiconductor device according to this embodiment, the insulating layer 21 is disposed directly adjacent to the n-type well 2 so as to surround sides of the n-type well 2. The bottom of the insulating layer 21 is positioned deeper than a junction interface $J_1$. The insulating layer 21 does not allow a junction interface with a p-type region such as the p-type substrate 1 to be formed on the sides of the n-type well 2. In the above-mentioned structure, the depletion layers $K_2$ and $K_3$ as the capacitances $C_2$ and $C_3$ on the sides of the n-type well 2 in the device illustrated in FIG. 1 are replaced by the capacitance of the insulating layer 21 in the device according to this embodiment.

Figure 7:
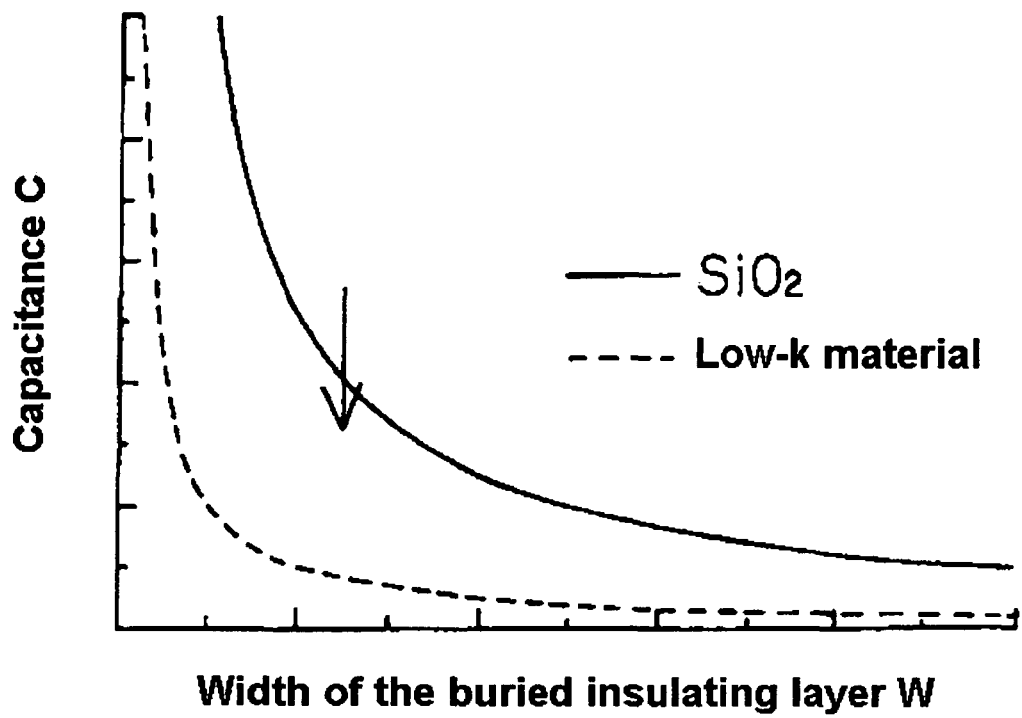
FIG. 7 is a graph illustrating a relationship between a width of a buried insulating layer and a capacitance thereof.

The capacitance of the insulating layer 21 is smaller than the capacitances of the depletion layers $K_2$ and $K_3$, and, as illustrated in FIG. 7 referred to below, becomes smaller as a width W of the insulating layer 21 becomes larger. Therefore, by making the width W of the insulating layer 21 as large as possible, the capacitances $C_2$ and $C_3$ on the sides of the n-type well 2 can be made as small as possible. It should be noted that the upper limit of the width W of the insulating layer 21 is specified depending on the area per cell.

Next, a method of manufacturing a semiconductor device having the above-mentioned structure is described with reference to FIGS. 3A to 3D.

As illustrated in FIG. 3A, first, ions of a predetermined amount and of a predetermined species (for example, phosphorus (P)) are implanted in a predetermined region of the p-type substrate 1, and, by diffusing and activating the implanted ions in a heating process, the n-type well 2 is formed. In this case, the depth position of the junction interface $J_1$ on the bottom side of the n-type well 2 may be the same through all colors (RGB) of the cells, or may be appropriately adjusted depending on the R, G, and B colors of the cells. Then, the heavily doped n-type region 4 is formed in the region of the n-type well 2 at a middle or center of the n-type well in a width direction thereof.

The heavily doped n-type region 4 is formed by further implanting ions of a high concentration into a part of the region of the n-type well 2.

In the state illustrated in FIG. 3A, similarly to the state illustrated in FIG. 1, the junction interfaces $J_2$ and $J_3$ exist between the sides of the n-type well 2 and the p-type substrate 1. Therefore, in this embodiment, in order to prevent the depletion layers $K_2$ and $K_3$ from being formed on the sides of the n-type well, as illustrated in FIGS. 3B and 3C, trenches 22 are formed at positions on the sides of the n-type well where the junction interfaces $J_2$ and $J_3$ exist, that is, at positions where the depletion layers $K_2$ and $K_3$ become substantially in parallel with the direction of incident light, to remove the junction interfaces $J_2$ and $J_3$ (depletion layers $K_2$ and $K_3$). The insulating layer 21 is formed in the trenches 22 to perform isolation. In this case, in order to perform the isolation without fail, it is preferable that the trenches 22 be formed such that the bottom thereof is positioned deeper than the junction interface $J_1$ and the insulating layer 21 be filled thereinto.

It should be noted that the width W of the insulating layer 21 and the trenches 22 is required to be at least larger than the width of the depletion layers $K_2$ and $K_3$ generated by the junction interfaces $J_2$ and $J_3$ (a dimension perpendicular to the junction interface is defined as the width of the depletion layers). Usually, the depth of a depletion layer depends on the concentration of the PN junction. When the applied bias is zero, the width of the depletion layer in the case of an abrupt junction between heavily doped regions is about 1 µm, and the width of the depletion layer in the case of an abrupt junction between lightly doped regions is about 1.5 µm. Therefore, the width W of the insulating layer 21 and the trenches 22 is at least 1 µm, and preferably 1.5 µm or more. Further, when the depth position of the junction interface $J_1$ of the n-type well 2 is, for example, about 1.0 µm, the width of 1.5 µm of the generated depletion layers is added to the above-mentioned depth position and an additional margin is further added thereto. Specifically, a depth D of the insulating layer 21 and the trenches 22 (position of depth from the surface of the p-type substrate 1 is defined as the depth) is preferably about 3.0 µm.

Then, as illustrated in FIG. 3D, the interlayer insulating film 5, the metal line 6, the protective film 7, and the like are formed on the surface of the device. By arranging such devices in a plane as an array, cells of the RGB colors forming the image sensor are formed. It should be noted that, although not shown in the figures, a light separating member (for example, a color filter) for separating incident light into light having wavelengths of the R, G, and B bands is disposed above each of the cells such that light having the wavelengths of the respective bands and separated by the light separating member enter the respective cells for the RGB colors.

Improvement of the output voltage can be obtained in a cell having the above-mentioned structure in the photoelectric conversion of incident light performed in the depletion layer $K_1$ generated in a vicinity of the junction interface $J_1$ since replacement of the depletion layers $K_2$ and $K_3$ on the sides of the n-type well 2 with the insulating layer 21 causes decrease of the excess parasitic capacitance. As a result, high efficiency in photoelectric conversion of incident light can be achieved, and the sensitivity of detection can be improved.

(Embodiment 2)

In Embodiment 1, in order to form the wide insulating layer and trenches, the area of a unit device of a cell may become large. When the area of a unit device of a cell cannot be made large, forming the wide insulating layer and trenches may decrease a substantial light receiving area. In this embodiment, the substantial light receiving area is prevented from decreasing even when the wide insulating layer and trenches are formed. A structure of a semiconductor device according to this embodiment having the characteristics is described with reference to FIGS. 4 and 5. It should be noted that, in FIGS. 4, and 5, the same reference symbols are used to denote identical members of the structure illustrated in FIG. 1 and description thereof is omitted.

Figure 4:
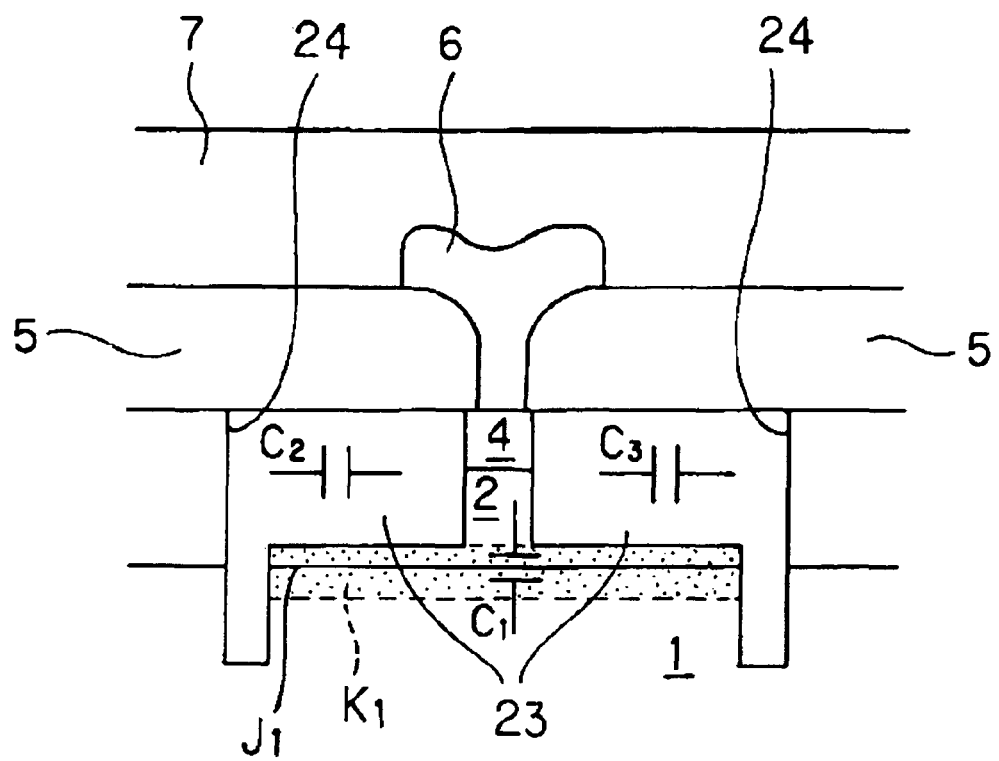
FIG. 4 illustrates a structure of another exemplary semiconductor device (Embodiment 2) according to the present invention.
Figure 5:
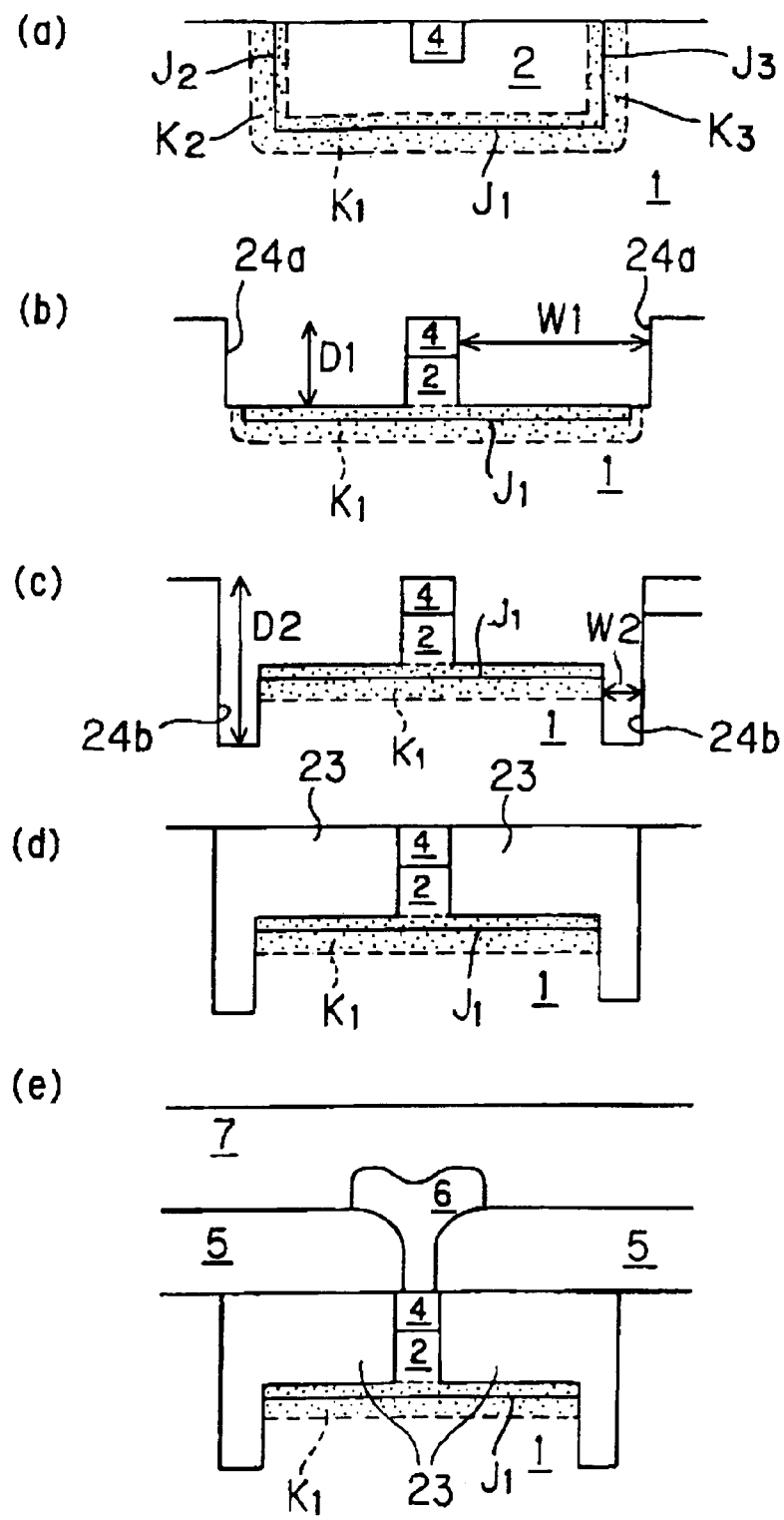
FIGS. 5A to 5E illustrate a method of manufacturing the semiconductor device illustrated in FIG. 4.

As illustrated in FIG. 4, the semiconductor device according to this embodiment has a basic structure which is substantially equal to that of the semiconductor device of Embodiment 1 illustrated in FIG. 2, but the structures of the n-type well 2 and an insulating layer 23 formed of an oxide film or the like for isolation are different.

Specifically, in the semiconductor device according to this embodiment, the step-like insulating layer 23 is disposed so as to be directly adjacent to the sides and the above portion of the n-type well 2 such that only a region of the n-type well 2 immediately below the heavily doped n-type region 4 and the region on the bottom side of the n-type well 2 to become the depletion layer $K_1$ are left. This prevents a junction interface with a p-type region from being formed on the sides of the n-type well 2. Further, the bottom of the insulating layer 23 is disposed at a position which is deeper than the junction interface $J_1$. In other words, the insulating layer 23 performs isolation and removes the depletion layers on the sides of the n-type well 2. Further, the insulating layer 23 removes the n-type well 2 above the depletion layer $K_1$ in a region of the n-type well 2 other than portions thereof immediately below the heavily doped n-type region 4.

In the above-mentioned structure, the depletion layers $K_2$ and $K_3$ serving as the capacitances $C_2$ and $C_3$ on the sides of the n-type well 2 in the device structure illustrated in FIG. 1 are replaced by the capacitance of the insulating layer 23 in the device according to this embodiment. Further, because the width of the insulating layer 23 extends to positions immediately below the heavily doped n-type region 4, the width of the insulating layer 23 can be made larger without making larger the area of a unit device of a cell, and thus, as illustrated in FIG. 7 referred to below, the capacitances $C_2$ and $C_3$ of the insulating layer 23 can be made still smaller.

Next, a method of manufacturing the semiconductor device of the above-mentioned structure is described with reference to FIGS. 5A to 5E.

First, as illustrated in FIG. 5A, the n-type well 2 is formed in a predetermined region of the p-type substrate 1. Then, the heavily doped n-type region 4 is formed in the region of the n-type well 2 at a middle or center of the n-type well in a width direction thereof. This is the same as the process illustrated in FIG. 3A of Embodiment 1.

Then, in order to prevent depletion layers from being generated on the sides of the n-type well 2, as illustrated in FIG. 5B, trenches 24a are formed at positions on the sides of the n-type well where the junction interfaces $J_2$ and $J_3$ exist. In this case, in order to leave only the region of the depletion layer $K_1$ generated by the junction interface, a depth D1 of the trenches 24a is to the a vicinity of a top of the depletion layer $K_1$. Further, a width W1 of the trenches 24a is set to be at least larger than the width of the depletion layers $K_2$ and $K_3$ generated by the junction interfaces $J_2$ and $J_3$. In addition, in a direction toward a center of the device, the width W1 is set to ends of the heavily doped n-type region 4 to thereby leave the n-type well 2 only under the heavily doped n-type region 4. By widening the width W1 of the trenches 24a in the direction toward the center of the n-type well 2 in this way, the width W1 of the trenches 24a can, without fail, be made larger than the width of the depletion layers $K_2$ and $K_3$ generated by the junction interfaces $J_2$ and $J_3$ without making larger the area of the device. It is sufficient to secure the width W1 of the trenches 24a of, similarly to the case of Embodiment 1, at least 1 µm or more, and preferably 1.5 µm or more. In this embodiment, when the area of a unit device is 25×25 µm², it is possible to secure the width W1 of about 10 µm.

Then, as illustrated in FIG. 5C, trenches 24b each having a smaller width are further formed at ends of the bottoms of the trenches 24a. In this case, a width W2 of the trenches 24b is set to be as small as possible, for example, about 0.5 µm with which the isolation can be performed without fail and the depletion layer $K_1$ which mainly contributes to the photoelectric conversion can be secured as wide as possible. In other words, a light receiving area which is as large as possible can be secured without making larger the area of a unit device of a cell. Further, a depth D2 of the trenches 24b is set such that the isolation is performed without fail, that is, set to positions deeper than the junction interface $J_1$. For example, similarly to the case of Embodiment 1, when the depth of the junction interface $J_1$ of the n-type well 2 is about 1.0 µm, the depth D2 of the trenches 24b is preferably the depth of the junction interface $J_1$ plus the width of the generated depletion layers which is 1.5 µm, with additional margin. Specifically, the depth D2 of the trenches 24b is preferably about 3.0 µm.

Then, as illustrated in FIG. 5D, the insulating layer 23 is formed and buried in the trenches 24a and 24b.

Then, as illustrated in FIG. 5E, the interlayer insulating film 5, the metal line 6, the protective film 7, and the like are formed on the surface of the device. By arranging the devices in a plane as an array, cells of the RGB colors forming the image sensor are formed. It should be noted that, although not shown in the figures, a light separating member (for example, a color filter) for separating incident light into light having wavelengths of the R, G, and B bands is disposed above each of the cells such that light having the wavelengths of the respective bands and separated by the light separating member enter the respective cells for the RGB colors.

The output voltage can be improved In a cell having the above-mentioned structure in the photoelectric conversion of incident light performed in the depletion layer $K_1$ generated in a vicinity of the junction interface $J_1$ since replacement of excess portions of the n-type well 2 with the insulating layer 23 enables decrease of the excess parasitic capacitance. Further, because the insulating layer 23 as deep as the depletion layer $K_1$ which mainly contributes to the photoelectric conversion is made narrower to secure a large area of the depletion layer $K_1$, a large light receiving area can be secured without making larger the area of a unit device of a cell. As a result, high efficiency in photoelectric conversion of incident light can be achieved, and the sensitivity of detection can be improved. It should be noted that, the effect of decreasing the parasitic capacitance is large in the case of this embodiment because the parasitic capacitance at the depletion layer $K_1$ is generated only at a portion where the n-type well 2 left immediately below the heavily doped n-type region 4 is in contact with the depletion layer $K_1$.

(Embodiment 3)

A semiconductor device according to this embodiment also prevents the substantial light receiving area from being decreased even when a wide insulating layer and wide trenches are formed similarly to the case of Embodiment 2, but each shape of the insulating layer and the trenches is different from that of Embodiment 2. A structure of the semiconductor device according to this embodiment is described with reference to FIG. 6. It should be noted that, in FIG. 6, the same reference symbols are used to denote identical members of the structures of Embodiments 1 and 2 and description thereof is omitted.

Figure 6:
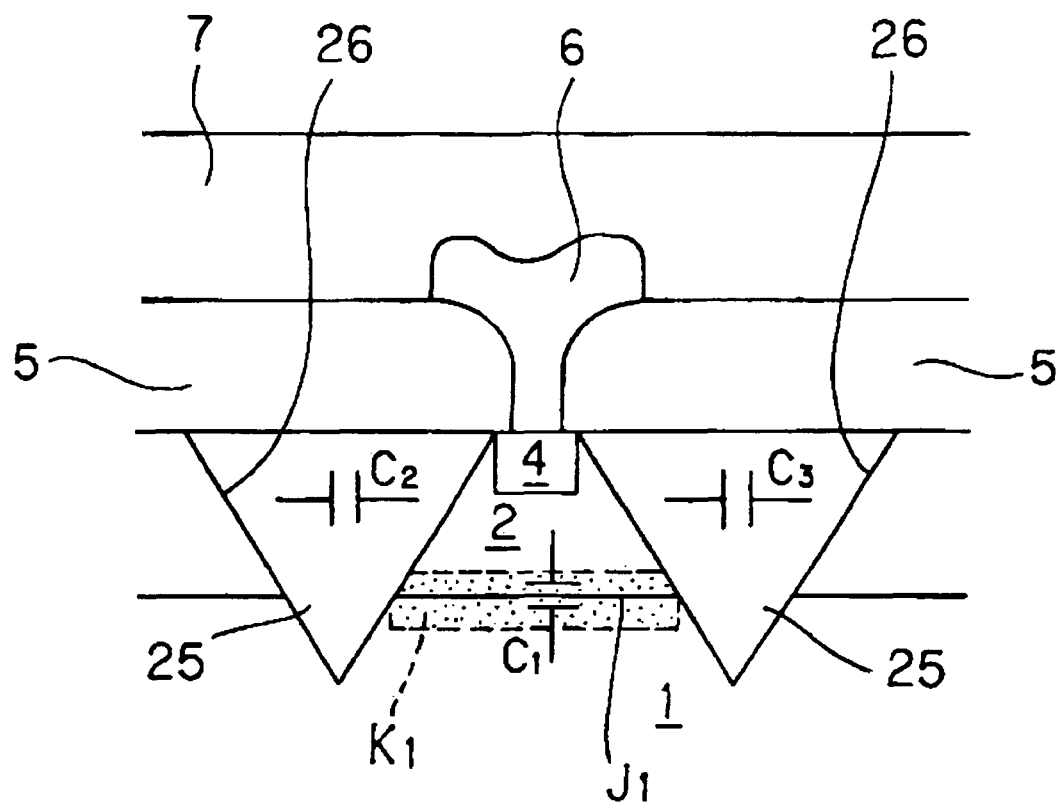
FIG. 6 illustrates a structure of still another exemplary semiconductor device (Embodiment 3) according to the present invention.

As illustrated in FIG. 6, the semiconductor device according to this embodiment has a basic structure which is substantially equal to that of the semiconductor device of Embodiment 1 illustrated in FIG. 2 or of Embodiment 2 illustrated in FIG. 4, but the structures of the n-type well 2 and an insulating layer 25 formed of an oxide film or the like for isolation are different.

Specifically, in the semiconductor device according to this embodiment, the insulating layer 25 (trenches 26) in the shape of an inverse triangle in section is disposed so as to surround sides of the n-type well 2 and so as to be directly adjacent to the n-type well 2, preventing the formation of a junction interface with a p-type region on the sides of the n-type well 2.

The insulating layer 25 has, at an upper portion thereof, a width which is at least larger than that of depletion layers generated by junction interfaces on the sides of the n-type well 2, and which, further, is widened toward a center of the device to ends of the heavily doped n-type region 4. Further, the insulating layer 25 has, at a lower portion thereof at a depth of a bottom of the depletion layer $K_1$, a width which is at least larger than that of the depletion layers generated by the junction interfaces on the sides of the n-type well 2, and which, further, is the minimum width with which isolation can be performed. Further, bottoms of the insulating layer 25 are deeper than the junction interface $J_1$. Therefore, at the upper portion of the insulating layer 25, the width of the insulating layer 25 is secured to be as large as possible to decrease the parasitic capacitance, while, at the lower portion of the insulating layer 25 at a depth of the depletion layer $K_1$, the width of the insulating layer 25 is made to be the smallest possible width to secure the depletion layer $K_1$ as large as possible, thereby securing a largest possible light receiving area.

The insulating layer 25 in the above-mentioned shape is formed by, after the n-type well 2 is formed in the predetermined region of the p-type substrate 1, forming the trenches 26 in the shape of an inverse triangle in section by anisotropic etching so as to remove the junction interface with the p-type substrate 1 on the sides of the n-type well 2, and after that, burying an insulating material such as a silicon oxide film in the trenches 26. The anisotropic etching is attained through performing wet etching using an alkali aqueous solution such as potassium hydroxide (KOH). For example, when a (100) surface of the silicon substrate is wet etched using KOH, an inclination of about 55° can be obtained.

In the above-mentioned structure, the depletion layers $K_2$ and $K_3$ serving as the capacitances $C_2$ and $C_3$ on the sides of the n-type well 2 in the device illustrated in FIG. 1 are replaced by the capacitance of the insulating layer 25 in the device according to this embodiment. Because the width W of the insulating layer 25 can be made larger without making larger the area of a unit device of a cell, as illustrated in FIG. 7, the capacitances $C_2$ and $C_3$ can be made still smaller.

It should be noted that, generally, the width W of the buried insulating layer and the capacitance C thereof have a relationship illustrated in a graph of FIG. 7, and the larger the width W of the buried insulating layer is, the smaller the capacitance C can be made. A material of the buried insulating layer may be a silicon oxide film which is an insulator, but, in order to decrease the capacitance, as illustrated in FIG. 7, a Low-k material having a low permittivity (for example, a silicon based insulating compound such as porous $SiO_2$ or SiOC) is more preferable. When the Low-k material is used, because the capacitance C can be made still smaller, if the parasitic capacitance is the same, the width W may be smaller, which makes it possible to decrease the area of a unit device of a cell.

The output voltage can be improved In a cell having the above-mentioned structure in the photoelectric conversion of incident light performed in the depletion layer $K_1$ generated in a vicinity of the junction interface $J_1$, since replacement of excess portions of the n-type well 2 with the insulating layer 25 enables decrease of the excess parasitic capacitance. Further, because the insulating layer 25 as deep as the depletion layer $K_1$ which mainly contributes to the photoelectric conversion is made narrower to secure a large area of the depletion layer $K_1$, a large light receiving area can be secured without making the area of a unit device of the cell larger. As a result, high efficiency in photoelectric conversion of incident light can be achieved, and the sensitivity of detection can be improved.

The present invention is suitable for a photodiode forming a cell of an image sensor, but is also applicable to other devices having a diode structure for the purpose of decreasing parasitic capacitance.

What is claimed is:

1. A semiconductor device for performing photoelectric conversion of incident light, comprising:
    a substrate formed of one of an n-type semiconductor and a p-type semiconductor;
    a well region having a predetermined depth and formed of the other of the n-type semiconductor and the p-type semiconductor in a predetermined region of the substrate;
    a depletion layer generated in a vicinity of a junction interface between the substrate and the well region;
    a first trench provided so as to remove the junction interface on sides of the well region, the first trench having a depth equal to a height up to a top portion of the depletion layer generated on a bottom side of the well region and having a width extending to a heavily doped region formed in and at a center of the well region in a width direction thereof so that the well region is reduced to only a region under the heavily doped region;
    a second trench formed at an end of a bottom of the first trench and provided so as to remove the junction interface on the sides of the well region, the second trench having a depth larger than that of a portion of the depletion layer generated on the bottom side of the well region and having a width larger than that of portions of the depletion layer generated on the sides of the well region; and
    an insulator buried into each the first trench and the second trench.

2. A semiconductor device according to claim 1; wherein the first trench has a width of at least 1 μm.

3. A semiconductor device according to claim 1; wherein the first trench has a width of about 1.5 μm or greater.

4. A semiconductor device according to claim 1; wherein a depth of the second trench is about 3 μm.

5. A semiconductor device according to claim 1; wherein the heavily doped region is electrically connected to and has the same conductivity type as that of the well region; and further comprising interlayer insulating film formed on the insulators and the well region, a metal line formed through the interlayer insulating film and connected to the heavily doped region, and a protective film formed on the interlayer insulating film and the metal line.

6. A semiconductor device according to claim 1; wherein the insulator comprises one of silicon oxide and a silicon based insulating compound having a low permittivity.

7. A semiconductor device for performing photoelectric conversion, the semiconductor device comprising:
a substrate having a first conductivity type;
a well region having a second conductivity type different from the first conductivity type;
a depletion layer generated in a vicinity of a junction interface between the substrate and the well region;
a heavily doped region formed in and at a center of the well region in a width direction thereof;
a first trench having a depth equal to a height up to a top portion of the depletion layer generated on a bottom side of the well region and a width extending to the heavily doped region so that the well region is reduced to only a region under the heavily doped region;
a second trench formed at an end of a bottom of the first trench so as to remove the junction interface on the sides of the well region, the second trench having a depth larger than that of a portion of the depletion layer generated on the bottom side of the well region and having a width larger than that of portions of the depletion layer generated on the sides of the well region; and
an insulator buried into each the first trench and the second trench.

8. A semiconductor device according to claim 7; wherein the first trench has a width of at least 1 μm.

9. A semiconductor device according to claim 7; wherein the first trench has a width of about 1.5 μm or greater.

10. A semiconductor device according to claim 7; wherein a depth of the second trench is about 3 μm.

11. A semiconductor device according to claim 7; wherein the heavily doped region is electrically connected to and has the same conductivity type as that of the well region; and further comprising interlayer insulating film formed on the insulators and the well region, a metal line formed through the interlayer insulating film and connected to the heavily doped region, and a protective film formed on the interlayer insulating film and the metal line.

12. A semiconductor device according to claim 7; wherein the insulator comprises one of silicon oxide and a silicon based insulating compound having a low permittivity.

* * * * *